(12) United States Patent
Resta et al.

(10) Patent No.: US 7,203,087 B2
(45) Date of Patent: Apr. 10, 2007

(54) FAST READING, LOW CONSUMPTION MEMORY DEVICE AND READING METHOD THEREOF

(75) Inventors: Claudio Resta, Villa Di Tirano (IT); Ferdinando Bedeschi, Monza (IT); Guido Torelli, Sant'alessio Con Vialone (IT)

(73) Assignees: STMicroelectronics S.r.l., Agrate Brianza (IT); Ovonyx Inc., Rochester Hills, MI (US)

( * ) Notice: Subject to any disclaimer, the term of this patent is extended or adjusted under 35 U.S.C. 154(b) by 86 days.

(21) Appl. No.: 11/018,550

(22) Filed: Dec. 20, 2004

(65) Prior Publication Data

US 2005/0185572 A1    Aug. 25, 2005

(30) Foreign Application Priority Data

Dec. 23, 2003    (EP)    ................................. 03425820

(51) Int. Cl.
    G11C 11/00    (2006.01)
(52) U.S. Cl. ............. 365/148; 365/230.08; 365/185.18
(58) Field of Classification Search ................ 365/148, 365/230.08, 185.18
    See application file for complete search history.

(56) References Cited

U.S. PATENT DOCUMENTS

| | | | |
|---|---|---|---|
| 5,789,776 A * | 8/1998 | Lancaster et al. ........... 257/296 |
| 5,883,827 A | 3/1999 | Morgan ....................... 365/100 |
| 6,498,758 B1 * | 12/2002 | Pomar et al. ................ 365/214 |
| 6,879,513 B2 * | 4/2005 | Ooishi ......................... 365/158 |
| 6,965,521 B2 * | 11/2005 | Li et al. ...................... 365/148 |
| 2003/0026134 A1 | 2/2003 | Lowrey ................. 365/185.24 |

FOREIGN PATENT DOCUMENTS

EP    1 326 258 A2    7/2003

* cited by examiner

*Primary Examiner*—David Lam
(74) *Attorney, Agent, or Firm*—Lisa K. Jorgenson; David V. Carlson; Seed IP Law Group PLLC

(57) ABSTRACT

A memory device having a reading configuration and including a plurality of memory cells, arranged in rows and columns, memory cells arranged on the same column having respective first terminals connected to a same bit line and memory cells arranged on the same row having respective second terminals selectively connectable to a same word line; a supply line providing a supply voltage; a column addressing circuit and a row addressing circuit for respectively addressing a bit line and a word line corresponding to a memory cell selected for reading in the reading configuration. The column addressing circuit is configured to bias the addressed bit line corresponding to the selected memory cell substantially at the supply voltage in the reading configuration. A row driving circuit biases the addressed word line corresponding to the selected memory cell at a non-zero word line read voltage, so that a predetermined cell voltage, lower than a phase change voltage, is applied between the first terminal and the second terminal of the selected memory cell in the reading configuration.

25 Claims, 5 Drawing Sheets

US 7,203,087 B2

FAST READING, LOW CONSUMPTION MEMORY DEVICE AND READING METHOD THEREOF

BACKGROUND OF THE INVENTION

1. Field of the Invention

The present invention relates to a fast reading, low consumption memory device and to a reading method thereof. The invention is particularly suited for phase change memories (PCM), although it may be advantageously exploited for other kinds of memories as well.

2. Description of the Related Art

As is known, phase change memory elements exploit the characteristics of materials which have the property of changing between two phases having distinct electrical characteristics. For example, these materials may change from an amorphous phase, which is disorderly, to a crystalline or polycrystalline phase, which is orderly, and the two phases are associated to considerably different resistivities.

At present, alloys of elements of group VI of the periodic table, such as Te or Se, referred to as chalcogenides or chalcogenic materials, can advantageously be used in phase change cells. The chalcogenide that currently offers the most promise is formed by a Ge, Sb and Te alloy ($Ge_2Sb_2Te_5$), which is currently widely used for storing information in overwritable disks.

In chalcogenides, the resistivity varies by two or more magnitude orders when the material passes from the amorphous phase (more resistive) to the polycrystalline phase (more conductive) and vice versa.

The use of PCM elements for forming memory cells and arrays has already been proposed. In particular, in phase change memories, a thin film of chalcogenic material is employed as a programmable resistor, which can be electrically heated by a controlled current so as to be switched between a high and a low resistance condition. The state of the chalcogenic material may be read applying a sufficiently small voltage so as not to cause a sensible heating and measuring the current passing through it. Since the current is proportional to the conductance of the chalcogenic material, it is possible to discriminate between the two states.

Regarding phase change memories reading, one of the problems to deal with is to prevent too high voltages from being accidentally applied either to selected or to unselected PCM cells of a memory array, even during transients. High voltages, in fact, may cause undesired phase transitions of some PCM cells and loss of information stored therein. In order to prevent high voltages and noise caused by adjacent memory cells, each PCM cell is generally associated to a selection element, normally a PNP bipolar transistor. In this case, each PCM cell is connected between a respective bit line and the emitter terminal of the PNP bipolar transistor forming the respective selection element. The selection element is turned on when the corresponding PCM cell is to be read and is turned off otherwise. In particular, if the selection element is a PNP bipolar transistor, a PCM cell is selected by grounding the base terminal of the corresponding selection element and by biasing the corresponding bit line at a regulated reference voltage; on the contrary, the voltage on the base terminal of a selection element is raised, and the corresponding bit line is left floating or driven to a relatively lower voltage, in order to turn off the selection element and to deselect the corresponding PCM cell.

However, leakage currents flow through cut-off selection elements and tend to charge parasitic capacitances usually associated to the bit lines of the memory array. Furthermore, leakage currents are even greater in the case a column decoder associated to the PCM memory array comprises a bit line driver stage using natural transistors as bit line voltage regulating elements. More precisely, in known memory devices, the bit line voltage regulating elements are transistors receiving a reference voltage on their control terminals and having different conductivity with respect to the decoding transistors (normally, NMOS transistors instead of PMOS transistors); natural transistors are preferred and often required to meet low supply voltage requirements, which are becoming more and more important. In order to avoid dangerous voltages, the bit lines of the whole memory array or at least the bit lines of an addressed sector of the memory array must be fully discharged before reading. In fact, the selecting elements maintain one terminal of the selected PCM cell at around the ground voltage during reading, whereas the other terminal is at the voltage of the corresponding bit line. However, the voltage on the deselected bit lines is rather high, on account of the leakage currents, so that selecting a PCM cell without discharging the corresponding bit line could easily cause undesired phase transitions.

The need for fully discharging the bit lines is clearly disadvantageous. On the one hand, in fact, repeatedly charging and discharging the bit lines lead to increased power consumption; on the other hand, reading operation is slow, since a complete discharge transient has to expire before the memory array may be properly biased. Another problem of the known memory devices is caused by the bit line voltage regulating elements. Even in the case that the bit line voltage regulating elements comprise standard transistors, in fact, their threshold voltages are sensitive to temperature variations. In other words, the bias voltage provided to the bit lines may be unstable under certain conditions.

Similar drawbacks affect also other kinds of memory devices, such as ferroelectric memories, wherein supplying too high voltages is critical and may lead either to loss of information or to reading errors.

BRIEF SUMMARY OF THE INVENTION

The aim of the present invention is to provide a memory device and a reading method thereof which are free from the above described drawbacks.

According to the present invention there are provided a fast reading, low consumption memory device and a reading method thereof, as defined in claims 1 and 15, respectively.

BRIEF DESCRIPTION OF THE SEVERAL VIEWS OF THE DRAWING(S)

For a better understanding of the present invention, preferred embodiments thereof are now described, purely by way of non-limiting example, with reference to the attached drawings, in which.

DETAILED DESCRIPTION OF THE INVENTION

Hereinafter, reference will be made to phase change memory devices; however, the invention could be advantageously exploited for other kinds of memories as well, such as ferroelectric memories.

Figure 1:
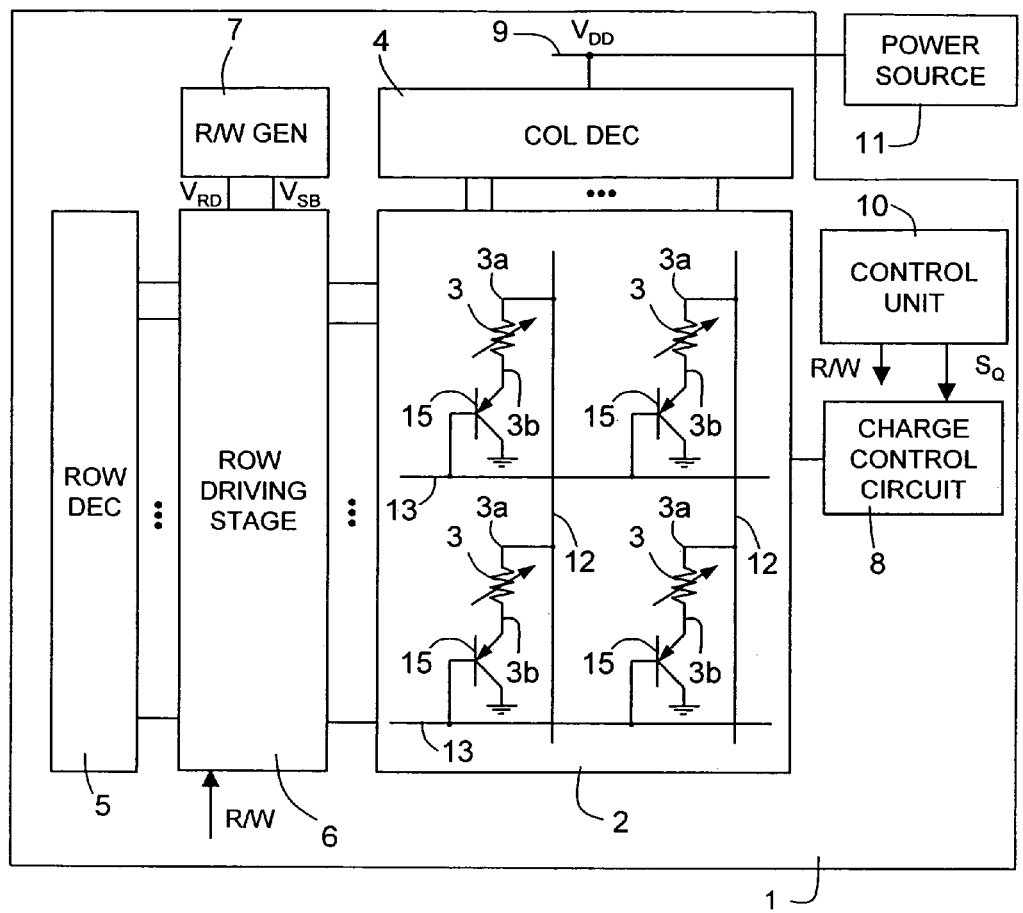
FIG. 1 is a block diagram of a phase change memory device according to a first embodiment of the present invention.
Figure 2:
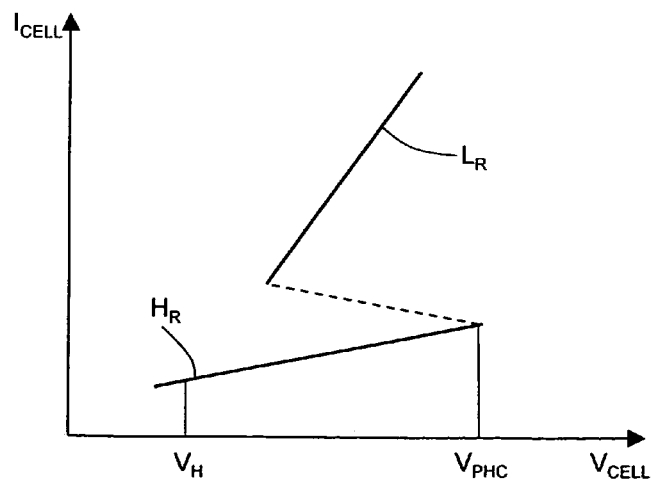
FIG. 2 is a graph showing an I–V characteristic of a memory cell of the memory device of FIG. 1.

With reference to FIG. 1, a phase change memory device 1 comprises an array 2 of PCM cells 3, arranged in rows and columns and schematically illustrated by symbols of variable resistors, a column decoder 4, a row decoder 5, a row driver stage 6, a read/write voltage generating circuit 7 (which will be hereinafter referred to as R/W generator 7), a charge control circuit 8, a supply line 9, and a control unit 10. In the embodiment herein described, the supply line is connected to an external DC power source 11 for providing a supply voltage $V_{DD}$ to the phase change memory device 1. Preferably, the power source 11 is a common power supply device for supplying also other devices of a system (not shown in FIG. 1) wherein the phase change memory device 1 is included. The PCM cells 3 of the array 2 have a current-voltage characteristic as illustrated in FIG. 2, where a low resistance state and a high resistance state are indicated with LR and HR, respectively. FIG. 2 further shows a phase change voltage $V_{PHC}$, corresponding to transitions from the high resistance state HR to the low resistance state LR, and a hold voltage $V_H$, which is not to be exceeded in order to prevent accidental phase transitions. Turning again to FIG. 1, PCM cells 3 arranged on the same column have respective first terminals 3a connected to a same common bit line 12; PCM cells 3 arranged on a same row have respective second terminals 3b coupled to a same word line 13 through respective selection transistor 15, in particular PNP bipolar transistors. Hence, second terminals 3b of the PCM cells 3 are selectively connectable to the corresponding word lines 13. More precisely, each of the selection transistors 15 has collector terminal grounded and emitter terminal connected to the second terminal 3b of the respective PCM cell 3; moreover, selection transistors 15 associated to PCM cells 3 arranged on a same row have respective base terminals connected to the same word line 13.

Figure 3:
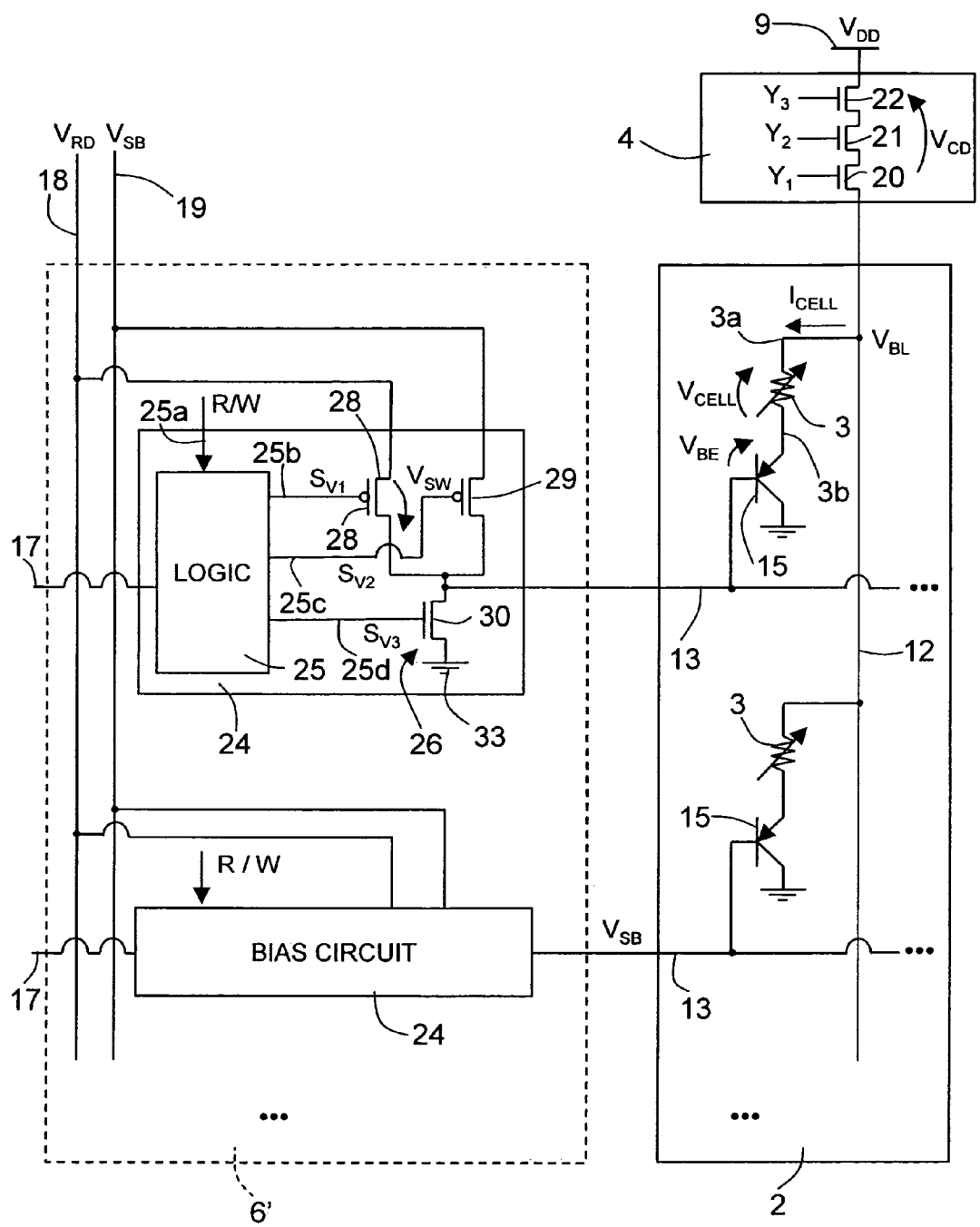
FIGS. 3 and 4 are simplified electrical diagrams of respective portions of the block diagram of FIG. 1.
Figure 4:
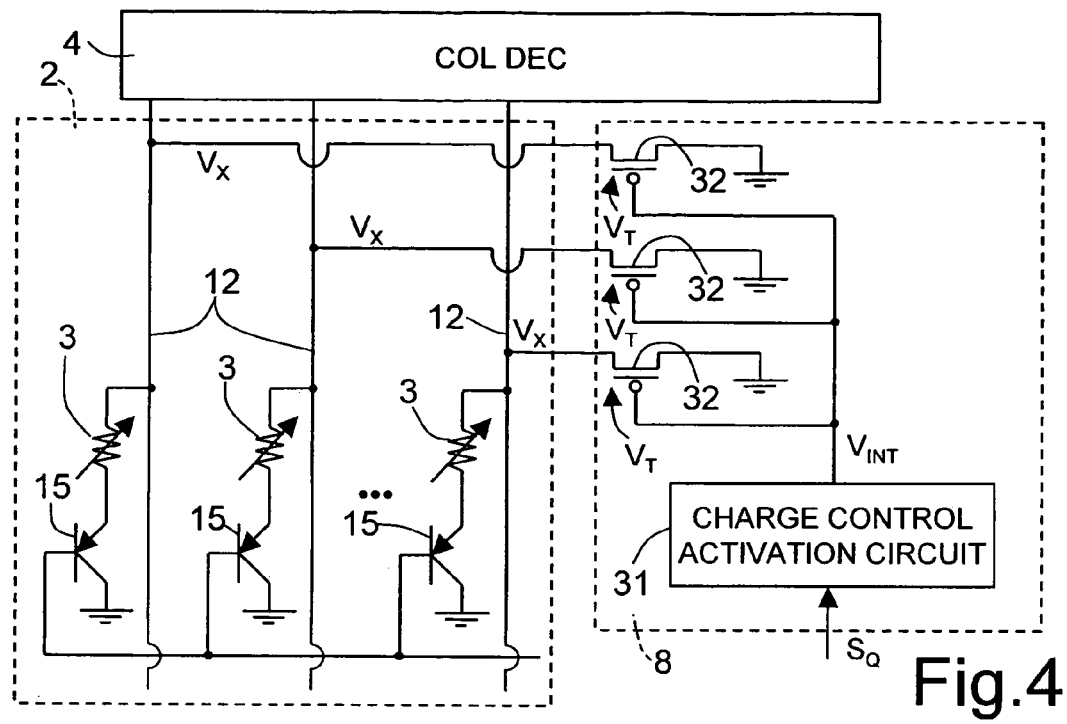

Referring to FIGS. 1, 3, and 4, the column decoder 4 is configured to selectively connect one of the bit lines 12 to the supply line 9.

The row driver stage 6 is connected between the row decoder 5 and the array 2. In particular, the row decoder 5 and the row driver stage 6 are mutually connected through a plurality of row select lines 17, each corresponding to a respective word line 13 of the array 2. The row decoder 5 is configured to selectively activate one of the row select lines 17, thereby selecting the corresponding word line 13. Furthermore, the row driver stage 6 is connected to the R/W generator 7 through a read bias line 18 and a deselect bias line 19, for receiving a read voltage $V_{RD}$ and a deselect voltage $V_{SB}$, respectively; and the control unit 10 supplies the row driver stage 6 with a read/write signal R/W, having a read logic level and a write logic level. In the presence of the read logic level of the read/write signal R/W, the row driver stage 6 supplies the read voltage $V_{RD}$ to a word line 13 selected by the row decoder 5, and the deselect voltage $V_{SB}$ to the other word lines 13 of the array 2.

The R/W generator 7 is per se known and is based, for example, on regulated charge pump circuits (here not shown).

The charge control circuit 8 is connected to the bit lines 12 of the array 2 and receives a charge control activation signal $S_Q$ from the control unit 10. In particular, when the charge control activation signal $S_Q$, which is a logic signal, is set at a predetermined activation value, the charge control circuit 8 controllably discharges the bit lines 12 to a predetermined charge control voltage $V_X$ (as will be explained later on, according to the present embodiment, the bit lines tend to be charged to the deselect voltage $V_{SB}$ when the charge control circuit 8 is deactivated).

FIG. 3 shows in greater detail a PCM cell 3 selected for reading by the corresponding selection transistor 15, bit line 12, and word line 13; moreover, in FIG. 3 a portion of the row driver stage 6 coupled to the selected PCM cell 3 is illustrated and the column decoder 4 is only schematically sketched.

The bit line 12 coupled to the selected PCM cell 3 is connected to the supply line 9 through the column decoder 4, which is a three level PMOS decoder in the embodiment herein described. In particular, the column decoder 4 comprises a plurality of first level transistors 20, a plurality of second level transistors 21 and a plurality of third level transistors 22, all of a same type, in particular, of PMOS type; for the sake of simplicity, FIG. 3 shows only one first level transistor 20, one second level transistor 21 and one third level transistor 22, which are involved in selecting the bit line 12 coupled to the PCM cell 3 to be read. It is to be noted that the bit line 12 is directly connected to the respective first level transistor 20. Moreover, gate terminals of the first, second and third level transistors 20–22 receive respective address signals Y1, Y2, Y3 from an external address bus of a known type and not shown herein.

The row driver stage 6 comprises a plurality of bias circuits 24, each coupled to a respective word line 13 (FIG. 3 illustrates in detail only the bias circuit 24 involved in selecting the word line 13 connected to the PCM cell 3 to be read). In particular, each of the bias circuit 24 comprises a respective logic circuit 25 and a respective switching circuit 26, controlled by the logic circuit 25. The logic circuit 25 has a row select input, connected to a respective row select line 17 from the row decoder 5, and a R/W input 25a, receiving the read/write signal R/W from the control unit 10. Furthermore, a first, a second and a third voltage select output 25b, 25c, 25d of the logic circuit 25 are connected to the switching circuit 26 and supply a first, a second and a third voltage select signal $S_{V1}$, $S_{V2}$, $S_{V3}$, respectively.

The switching circuit 26 comprises a read switch 28, a deselect switch 29, and a write switch 30. The read switch 28 and the deselect switch 29 are formed by PMOS transistors having gate terminals respectively connected to the first and second outputs 25b, 25c of the logic circuit 25, source terminals respectively connected to the read bias line 18 and to the deselect bias line 19, and common drain terminals connected to the corresponding word line 13; the write switch 30 is formed by a NMOS transistor having gate terminal connected to the third output 25d of the logic circuit 25, source terminal grounded and drain terminal connected to the corresponding word line 13.

In this case, a ground line 33 is used as a write bias line. The logic circuit 25 is configured so as to turn on one of the switches 28–30 and to deactivate the others, depending on the activation state of the corresponding row select line 17 and the read/write signal R/W. In particular, when the row select line 17 is deactivated by the row decoder 5, the logic circuit 25 turns on the deselect switch 29, thereby providing the deselect voltage $V_{SB}$ to the corresponding word line 13 (which is deselected). On the contrary, when the row select line 17 is activated (corresponding word line 13 selected), the logic circuit 25 alternatively turns on the read switch 28 or the write switch 30, depending on the read/write signal R/W being set at the read logic level or at the write logic level, respectively. Accordingly, the selected word line 13 is biased at appropriate voltage either for reading (word line read voltage $V_{WL}$) or writing (ground). Due to a voltage drop $V_{SW}$ across the source and drain terminals of the read switch 28 of the bias circuit 24, in a reading configuration of the phase change memory device 1 a word line read voltage $V_{WL}$ on the selected word line 13 is slightly higher than the read bias voltage $V_{RD}$.

In operation, the bit lines 12 tend to be charged at the deselect voltage $V_{SB}$, on account of leakage currents flowing through the selection transistors 15. The phase change memory device 1 is configured for reading upon receipt of a read request. The control unit 10 sets the read/write signal R/W at the read logic level and the charge control activation signal $S_Q$ at the activation value, so that the charge control circuit 8 drives the bit lines 12 to the charge control voltage $V_X$. Then, in a known manner, the column decoder 4 selects one of the bit lines 12 corresponding to a PCM cell 3 to be read, for connection to the supply line 9; accordingly, the selected bit line 12 and the first terminals 3a of the PCM cells 3 connected thereto, in particular the selected PCM cell 3, are biased substantially at the supply voltage $V_{DD}$.

More precisely, a bit line voltage $V_{BL}$ on the selected bit line 12 is slightly lower than the supply voltage $V_{DD}$, owing to a small voltage drop $V_{CD}$ across the active first, second and third level transistors 20–22 of the column decoder 4. The row driver stage 6 supplies the read bias voltage $V_{RD}$ to a word line 13 selected by the row decoder 5 and corresponding to the PCM cell 3 to be read, and the deselect bias voltage $V_{SB}$ to the other word lines 13 of the array 2. Hence, a cell current $I_{CELL}$ flows through the selected PCM cell 3 and the respective selection transistor 15; the value of the cell current $I_{CELL}$ is determined by the state of the chalcogenic material of the PCM cell 3.

The read bias voltage $V_{RD}$ and the word line read voltage $V_{WL}$ are non-zero (positive) voltages such that a suitable cell voltage $V_{CELL}$ drops across the selected PCM cell 3 and phase transition are prevented. In particular, the cell voltage $V_{CELL}$ is lower than the phase change voltage $V_{PHC}$, and preferably lower also than the hold voltage $V_H$. The following relation exists between the read bias voltage $V_{RD}$ and the cell voltage $V_{CELL}$:

$$V_{RD}=V_{DD}-V_{CD}-V_{CELL}-V_{BE}-V_{SW}=V_{WL}-V_{SW} \quad (1)$$

where $V_{BE}$ is a conduction base-emitter voltage of the selection transistors 15. In order to maintain in cut-off the other selection transistors 15 connected to the selected bit line 12 and preventing errors, the deselect bias voltage $V_{SB}$ has to comply with the following requirement:

$$V_{SB}>V_{DD}-V_{BE} \quad (2)$$

and, preferably:

$$V_{SB}=V_{DD} \quad (3)$$

For example, suitable voltage values may be the following: $V_{DD}=V_{SB}=3.6$ V; $V_{CD}=V_{CELL}=0.3$ V; $V_{BE}=0.7$ V; $V_{SW}=0.1$ V; and, according to equation (1), $V_{RD}=2.2$ V and $V_{WL}=2.3$ V.

With reference to FIG. 4, the charge control circuit 8 comprises a charge control activating circuit 31, which is controlled by the control unit 10 through the charge control activation signal $S_Q$ and is preferably based on an internal band-gap voltage generator (known and not shown); and a plurality of charge control transistors 32, each coupled to a respective bit line 13. More precisely, the charge control transistors 32 have source terminals connected to the respective bit line 13, drain terminals grounded, and gate terminals all connected to a common output of the charge control activating circuit 31. When activated, the charge control activating circuit 31 supplies on its output an intermediate voltage $V_{INT}$, such that $$V_X=V_{INT}+V_{TQ} \quad (4)$$

where $V_{TQ}$ is a threshold voltage of the charge control transistors 32. Moreover, the charge control voltage $V_X$ is a non-zero (positive) voltage and has to be as low as required to keep in cut-off condition the selection transistors 15 coupled to deselected bit lines 12. In practice, the charge control voltage $V_X$ is a positive voltage complying also with the following condition:

$$V_X<V_{RD}+V_{BE}+V_{SW} \quad (5)$$

or $$V_X<V_{WL}+V_{BE} \quad (6)$$

(according to the above example, $V_X<3$ V). Since the voltage on the bit lines 12 is initially close to the deselect voltage $V_{SB}$, the charge control transistors 32 are on, so that charge is drawn from the bit lines 12. As soon as the voltage on the bit lines 12 equals the charge control voltage $V_X$, the corresponding charge control transistors 32 turns off, thereby preventing further discharging. In other words, the charge control activating circuit 31 selectively activates the charge control transistors 32, so that the bit lines 12 are controllably discharged only to the charge control voltage $V_X$, before reading.

It is clear from the above that the invention provides several advantages. First, the bit lines may be controllably discharged to a pre-determined non-zero voltage, instead of being grounded (i.e., completely discharged). Accordingly, on the one side, parasitic power consumption is significantly reduced (up to 80%), since only a small amount of charge is removed before each reading operation (and later restored by the leakage currents); of course, the greater is the charge control voltage $V_X$, the greater is the reduction in power consumption. On the other side, the discharge transient is shorter, so that the bit lines are soon ready for reading and the reading operation is faster. Moreover, since the selected bit line is biased close to the supply voltage directly through the column decoder, a dedicated voltage regulator is no longer required. Hence, bias voltage supplied to the bit lines is stable and the need for natural transistors is overcome also in the case of low supply voltage devices. The phase change memory device according to the invention is simpler and cheaper to produce, compared to known memories.

Figure 5:
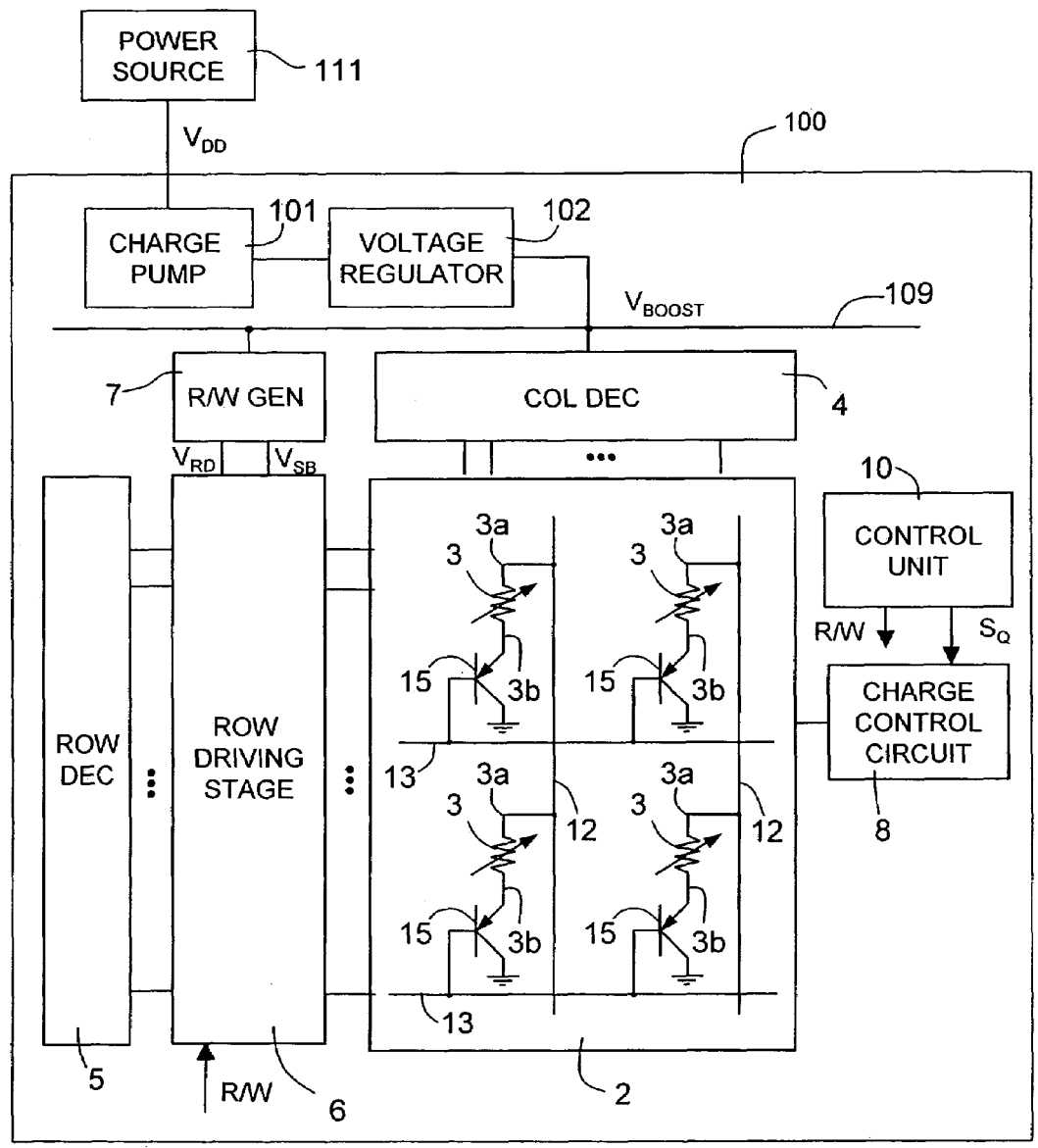
FIG. 5 is a block diagram of a phase change memory device according to a second embodiment of the present invention.

A second embodiment of the invention is illustrated in FIG. 5, where parts already described with reference to FIGS. 1–4 are indicated by the same numbers. According to the second embodiment case, a phase change memory device 100 comprises the array 2 of PCM cells 3, the column decoder 4, the row decoder 5, the row driver stage 6, the R/W generator 7), the charge control circuit 8 and the control unit 10. The phase change memory device 100 further includes a charge pump 101, a voltage regulator 102 and an internal supply line 109. The charge pump 101 is connected to an external power source 111, for receiving an external supply voltage $V_{PP}$, and to the voltage regulator 102. The column decoder 4 is connected to the voltage regulator 102 over the internal supply line 109.

When the phase change memory device 100 is configured for reading, the charge pump 101 co-operates with the voltage regulator 102 for supplying a regulated boosted voltage $V_{BOOST}$ on the internal supply line 109. The regulated boosted voltage $V_{BOOST}$ is higher than the supply voltage $V_{PP}$ and, in the embodiment herein described, is equal to a write voltage which is supplied to the bit lines 12 to bring selected PCM cells 3 either in a set (crystalline) state or in a reset (amorphous) state ($V_{BOOST}$=6 V, e.g.).

The read bias voltage $V_{RD}$ and the word line read voltage $V_{WL}$ are non-zero (positive) voltages such that a suitable cell voltage $V_{CELL}$ drops across the selected PCM cell 3 and phase transition are prevented. In the example herein described, the word line read voltage $V_{WL}$ is 4.85 V and the read bias voltage $V_{RD}$ is 4.75 V. Other suitable voltage values are $V_{SB}$=$V_{BOOST}$=6 V; $V_{CD}$=0.15 V; $V_{CELL}$=0.3 V; $V_{BE}$=0.7 V. Still, the charge control voltage $V_X$ is determined according to equation (6), hence $V_X$<5.55 V.

Figure 6:
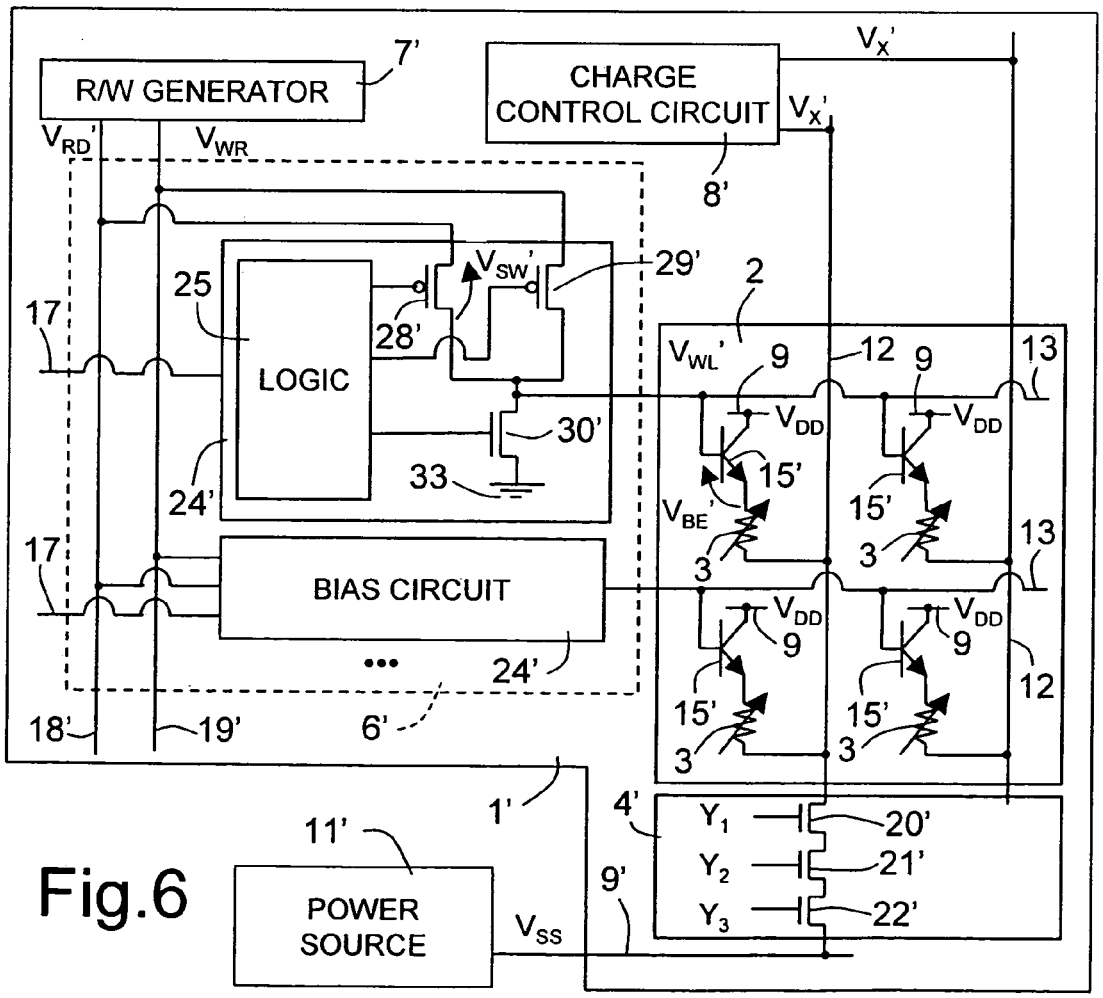
FIG. 6 is a simplified electrical diagram of a phase change memory device according to a third embodiment of the present invention.

According to a third embodiment of the invention, which will be described hereinafter, a phase change memory device 1' has a dual structure with respect to the phase change memory device 1 of FIG. 1. With reference to FIG. 6, where parts similar to those already described are designated by the same reference numbers, the phase change memory device 1' comprises the array 2 of PCM cells 3, a column decoder 4', a R/W generator 7', a charge control circuit 8', and selecting transistors 15', coupled to respective PCM cells 3. Furthermore, the phase change memory device 1' includes a negative voltage supply line 9' connectable to an external power source 11' providing a negative supply voltage $V_{SS}$.

The selecting transistors 15' are NPN bipolar transistors, having emitter terminals connected to respective PCM cells 3, drain terminals connected to the supply line 9', and base terminals connected to respective word lines 13.

The column decoder 4' is a three level NMOS decoder comprising first, second and third level transistors 20', 21', 22', and is configured for selectively connecting a bit line 12 to the negative voltage supply line 9'.

Moreover, the R/W generator 7' provides a read bias voltage $V_{RD}$' and a write bias voltage $V_{WR}$' on a read bias line 18' and on a write bias line 19', respectively; in this case, the ground line 33 is used as a deselect bias line.

Moreover, in each bias circuit 24 of the row driver stage 6, a read switch 28' and a write switch 29' are formed by PMOS transistors coupled to the read bias line 18' and, respectively, to the write bias line 19'; and a deselect switch 30' is formed by a NMOS transistor having a source terminal grounded. Due to a voltage drop $V_{SW}$' across the source and drain terminals of the read switch 28' of the bias circuit 24, in a reading configuration of the phase change memory device 1' a word line read voltage $V_{WL}$' on the selected word line 13 is slightly lower than the read bias voltage $V_{RD}$' (however, the absolute value of the word line read voltage $V_{WL}$' is greater than the absolute value of the read bias voltage $V_{RD}$'). The read bias voltage $V_{RD}$' and the word line read voltage $V_{WL}$' are non-zero (negative) voltages such that a suitable cell voltage $V_{CELL}$ drops across the selected PCM cell 3 and phase transition are prevented.

The charge control circuit 8' is connected to the bit lines 12 and is configured to controllably charge the bit lines 12 at a predetermined charge control voltage $V_X$'. According to the present embodiment of the invention, the deselect bias voltage of the bit lines is 0 V (ground voltage), so that the charge control voltage $V_X$' has to comply with the following requirement, in order to keep in cut-off the selecting transistors 15' coupled to deselected PCM cells 3:

$$V_X' > V_{RD}' - V_{BE}' - V_{SW}' = V_{WL}' - V_{BE}' \quad (7)$$

where $V_{BE}$' is a base-emitter voltage of the active selecting transistor 15' and $V_{SW}$' is a voltage across the read switch 28' (the absolute value of the charge control voltage $V_X$' is smaller than the absolute value of the word line read voltage $V_{WL}$').

Figure 7:
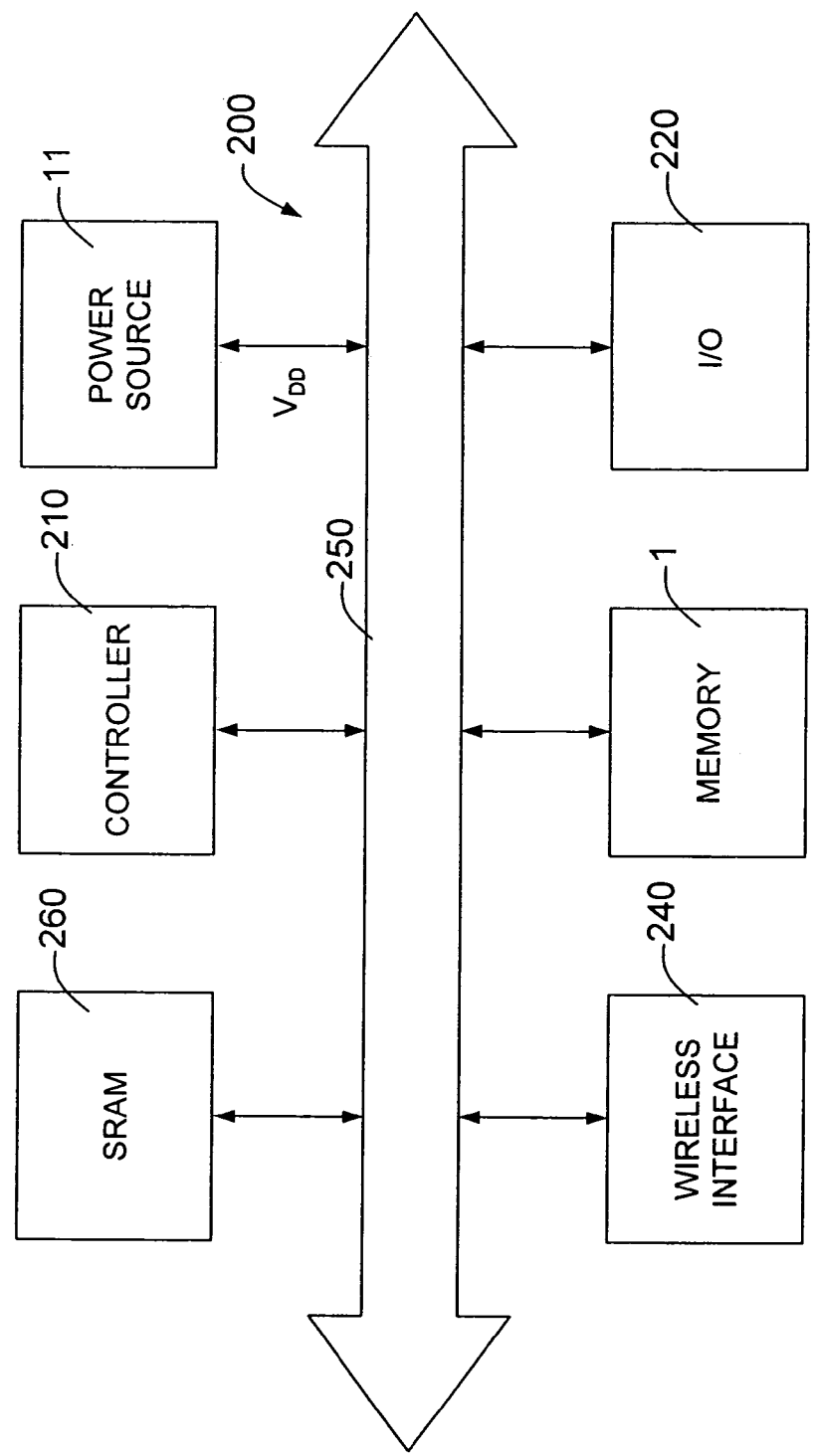
FIG. 7 is a system depiction of one embodiment of the present invention.

In FIG. 7, a portion of a system 200 in accordance with an embodiment of the present invention is described. System 200 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 200 may be used in any of the following systems: a wireless local area network (WLAN) system, a wireless personal area network (WPAN) system, or a cellular network, although the scope of the present invention is not limited in this respect.

System 200 may include a controller 210, an input/output (I/O) device 220 (e.g., a keypad, display), the phase change memory device 1, a wireless interface 240, and a static random access memory (SRAM) 260 and coupled to each other via a bus 250. The system 200 further includes the power source 11, which supplies power to the controller 210, the I/O device 220, the phase change memory device 1, the wireless interface 240 and the static random access memory 260. The power source 11 includes a battery in one embodiment. It should be noted that the scope of the present invention is not limited to embodiments having any or all of these components.

Controller 210 may comprise, for example, one or more microprocessors, digital signal processors, micro-controllers, or the like. The phase change memory device 1 may be used to store messages transmitted to or by system 200. The phase change memory device 1 may also optionally be used to store instructions that are executed by controller 210 during the operation of system 200, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 220 may be used to generate a message. The system 200 may use the wireless interface 240 to transmit and receive messages to and from a wireless communication network with a radio frequency (RF) signal. Examples of the wireless interface 240 may include an antenna, or a wireless transceiver, such as a dipole antenna, although the scope of the present invention is not limited in this respect. Also, the I/O device 220 may deliver a voltage reflecting what is stored as either a digital output (if digital information was stored), or as analog information (if analog information was stored).

While an example in a wireless application is provided above, embodiments of the present invention may also be used in non-wireless applications as well.

Finally, it is clear that numerous modifications and variations may be made to the phase change memory device described and illustrated herein, all falling within the scope of the invention, as defined in the attached claims. First, the memory device could be of a different type as well, in particular a ferroelectric memory device. Then, the column decoder may have different structure, in particular a different number of decoding levels. Similarly, also the bias circuits 24 may have different structure. Read voltages and deselect voltages may be provided by an external source, instead of being generated by the internal R/W generator 7. Control signals may be supplied by an external control unit as well. Furthermore, the array 2 may be divided in sectors, which are selectively activated. In this case, each sector is provided with a charge control circuit or, alternatively, an addressable charge control circuit is selectively coupled only to the bit lines of the sector to be read.

The invention claimed is:

1. A memory device having a reading configuration and comprising:
   a plurality of memory cells, arranged in rows and columns, wherein memory cells arranged on the same column have respective first terminals connected to a same bit line and memory cells arranged on the same row have respective second terminals selectively connectable to a same word line;
   a supply line providing a supply voltage;
   a column addressing circuit and a row addressing circuit for respectively addressing a bit line and a word line corresponding to a memory cell selected for reading in said reading configuration, said column addressing circuit being configured to bias said addressed bit line corresponding to said selected memory cell substantially at said supply voltage in said reading configuration; and
   a row driving circuit configured to bias said addressed word line corresponding to said selected memory cell at a non-zero word line read voltage, so that a predetermined cell voltage lower than a phase change voltage, is applied between said first terminal and said second terminal of said selected memory cell in said reading configuration.

2. A memory device according to claim 1, wherein said column addressing circuit comprises a plurality of addressing elements, all of a same type, and said addressed bit line corresponding to the memory cell to be read is directly connected to a respective said addressing element.

3. A memory device according to claim 1, wherein said row driving circuit comprises a plurality of bias circuits, coupled to respective word lines for selectively supplying a read bias voltage to said addressed word line and a deselect bias voltage to the other word lines.

4. A memory device according to claim 1, comprising a charge control circuit coupled to said bit lines for controllably driving said bit lines to a predetermined charge control voltage, wherein said charge control voltage is a non-zero voltage having an absolute value smaller than an absolute value of said word line read voltage.

5. A memory device according to claim 4, wherein said charge control circuit comprises a plurality of charge drawing elements, each coupled to a respective bit line, and an activating circuit for selectively activating said charge drawing elements.

6. A memory device according to claim 4, comprising a plurality of selecting elements, each coupled to a respective memory cell.

7. A memory device according to claim 6, wherein each of said selecting elements has a control terminal, connected to a respective word line and a conduction terminal, connected to the respective memory cell.

8. A memory device according to claim 7, wherein said selecting elements are PNP bipolar transistors.

9. A memory device according to claim 8, wherein said charge control voltage is a positive voltage and $$V_X > V_{WL} + V_{BE}$$

where $V_X$ is said charge control voltage, $V_{WL}$ is a word line voltage on said selected word line and $V_{BE}$ is a conduction base-emitter voltage of said selecting element coupled to said selected memory cell to be read.

10. A memory device according to claim 1, wherein said memory cells are phase change memory cells.

11. A memory device according to claim 1, wherein said supply line is connectable to an external power source for receiving said supply voltage.

12. A memory device according to claim 1, further comprising a voltage boosting circuit connectable to an external power source for receiving an external voltage and providing said supply voltage, wherein said supply voltage is a boosted voltage higher than said external voltage.

13. A system comprising:
    a processing unit;
    an interface coupled to said processing unit; and
    a nonvolatile phase change memory device according to claim 1, coupled to said processing unit.

14. A system according to claim 13, wherein said interface is a wireless interface.

15. A method for reading a memory device having a plurality of memory cells, arranged in rows and columns, memory cells arranged on the same column having respective first terminals connected to a same bit line and memory cells arranged on the same row having respective second terminals selectively connectable to a same word line;
    the method comprising the steps of:
    providing a constant supply voltage; and
    addressing a bit line and a word line for selecting a memory cell to be read by biasing said addressed bit line corresponding to the selected memory cell substantially at said supply voltage and biasing said addressed word line corresponding to said selected memory cell at a non-zero word line read voltage, so that a predetermined cell voltage, lower than a phase change voltage, is applied between said first terminal and said second terminal of said selected memory cell.

16. A method according to claim 15, wherein, before said step of addressing a bit line and a word line, said bit lines are controllably driven to a predetermined charge control voltage.

17. A method according to claim 16, wherein said charge control voltage is a positive voltage.

18. A method according to claim 15, wherein said memory cells are phase change memory cells.

19. A method according to claim 15, wherein said supply voltage is provided by an external power source.

20. A method according to claim 15, wherein said step of providing a constant supply voltage further comprises the steps of receiving an external voltage and boosting said external voltage, and wherein said supply voltage is a boosted voltage higher than said external voltage.

21. A memory device comprising:
    a plurality of memory cells, arranged in rows and columns, memory cells arranged on the same column coupled to a bit line, said memory cells having a first terminal and a second terminal;

column addressing logic configured to address a bit line corresponding to a memory cell to be read, said column addressing logic configured to bias said addressed bit line to approximately equal to a supply voltage; and row addressing logic configured to address a word line corresponding to a memory cell to be read and further configured to bias said addressed word line corresponding to said memory cell at a non-zero word line read voltage so that a predetermined cell voltage, lower than a phase change voltage, is applied between said first terminal and said second terminal of said memory cell in said reading configuration.

22. A memory device according to claim 21, wherein said memory cells are phase change memory cells.

23. A memory device according to claim 21, further comprising:

a line providing a bias voltage; and said column addressing logic is configured to bias said bit line to the bias voltage.

24. A memory device according to claim 21 further comprising:

means for controllably discharging the bit lines to a non-zero voltage.

25. A computer system comprising:

a power supply;

a data input device;

a data output device;

a memory device:

a plurality of memory cells, arranged in rows and columns, memory cells arranged on the same column coupled to a bit line, said memory cells having a first terminal and a second terminal;

column addressing logic configured to address a bit line corresponding to a memory cell to be read, said column addressing logic configured to bias said addressed bit line to approximately equal to a supply voltage; and row addressing logic configured to address a word line corresponding to a memory cell to be read and further configured to bias said addressed word line corresponding to said memory cell at a non-zero word line read voltage so that a predetermined cell voltage, lower than a phase change voltage, is applied between said first terminal and said second terminal of said memory cell in said reading configuration.

* * * * *

UNITED STATES PATENT AND TRADEMARK OFFICE
CERTIFICATE OF CORRECTION

PATENT NO.       : 7,203,087 B2
APPLICATION NO.  : 11/018550
DATED            : April 10, 2007
INVENTOR(S)      : Claudio Resta et al.

It is certified that error appears in the above-identified patent and that said Letters Patent is hereby corrected as shown below:

Column 10
Line 6, "$V_X > V_{WL} + V_{BE}$" should read as -- $V_X < V_{WL} + V_{BE}$ --

Signed and Sealed this

Twenty-fourth Day of June, 2008

JON W. DUDAS
*Director of the United States Patent and Trademark Office*